United States Patent
Iwakiri et al.

[11] Patent Number: 5,537,325
[45] Date of Patent: Jul. 16, 1996

[54] APPARATUS FOR AND METHOD OF MANUFACTURING SEMICONDUCTOR WAFER

[75] Inventors: Eiji Iwakiri; Shingo Fukushima; Yukitaka Takitani, all of Hiratsuka, Japan

[73] Assignee: Komatsu Electronic Metals Co., Ltd., Japan

[21] Appl. No.: 232,198

[22] PCT Filed: Oct. 29, 1992

[86] PCT No.: PCT/JP92/01401

§ 371 Date: Apr. 28, 1994

§ 102(e) Date: Apr. 28, 1994

[87] PCT Pub. No.: WO93/09565

PCT Pub. Date: May 13, 1993

[30] Foreign Application Priority Data

Oct. 29, 1991 [JP] Japan .................. 3-283241

[51] Int. Cl.$^6$ ........................... G06F 19/00
[52] U.S. Cl. ............... 364/468.28; 364/468.22
[58] Field of Search ............ 364/468, 401–403, 364/478, 131–136, 474.11, 474.15; 235/375

[56] References Cited

U.S. PATENT DOCUMENTS

| | | | |
|---|---|---|---|
| 4,821,198 | 4/1989 | Takeuchi et al. | 364/468 |
| 4,829,445 | 5/1989 | Burney | 364/478 |
| 4,930,086 | 5/1990 | Fukasawa | 364/468 |
| 5,126,932 | 6/1992 | Wolfson et al. | 364/468 |
| 5,237,508 | 8/1993 | Furukawa et al. | 364/468 |
| 5,375,061 | 12/1994 | Hara et al. | 364/468 |

FOREIGN PATENT DOCUMENTS

| | | |
|---|---|---|
| 2042709 | 4/1990 | European Pat. Off. . |
| 0488053 | 6/1992 | European Pat. Off. . |
| 3402655 | 8/1985 | Germany . |
| 52-229174 | 1/1977 | Japan . |
| 2126374 | 3/1984 | United Kingdom . |

OTHER PUBLICATIONS

IBM Technical Disclosure Bulletin, vol. 15, No. 7, Dec. 1972, New York US pp. 2273–2274.
IBM Technical Disclosure Bulletin, vol. 20, No. 8, Jan. 1978, New York US p. 3154.

*Primary Examiner*—Roy N. Envall, Jr.
*Assistant Examiner*—Thomas E. Brown
*Attorney, Agent, or Firm*—Welsh & Katz, Ltd.

[57] ABSTRACT

When an ingot is sliced into wafers, they are given serial numbers for identification. This makes possible to identify which any wafer being processed is of those sliced from the ingot no matter where the wafer is in a manufacturing process. Each wafer is traced so as to determine the path along which the wafer was transferred during the manufacturing process, and results are stored as wafer information.

4 Claims, 7 Drawing Sheets

| SILICON INGOT NO. | WAFER NO. | TRANSPORT JIG NO. | JIG NO. |
|---|---|---|---|
| AZE458-698 | 001 | 458 | 01 |
| AZE458-698 | 002 | 453 | 02 |
| AZE458-698 | 003 | 453 | 03 |
| AZE458-698 | 004 | 453 | 04 |
| AZE458-698 | 005 | 453 | 05 |
| ***** | | | |
| ***** | | | |
| ***** | | | |
| ***** | | | |
| ***** | | | |

FIG.4

| WAFER NO. | PLATE NO. | PLATE POSITION | TRANSPORT JIG NO. | JIG NO. |
|---|---|---|---|---|
| AZE458-698-001 | 0145 | 01 | 0012 | 01 |
| AZE458-698-002 | 0145 | 02 | 0012 | 02 |
| AZE458-698-003 | 0145 | 03 | 0012 | 03 |
| AZE458-698-004 | 0145 | 04 | 0012 | 04 |
| AZE458-698-005 | 0146 | 01 | 0012 | 05 |
| AZE458-698-006 | 0146 | 02 | 0012 | 06 |
| ************ | **** | ** | | |

FIG.8

APPARATUS FOR AND METHOD OF MANUFACTURING SEMICONDUCTOR WAFER

TECHNICAL FIELD

The present invention relates to an apparatus for and method of manufacturing semiconductor wafers and more particularly, to tracing of manufacturing history.

BACKGROUND ART

For semiconductor wafers of silicon, germanium, gallium arsenide (GaAs), etc. for use as the material of IC, LSI or the like, a higher quality of the wafers has been demanded year after year as highly integrated devices are required.

Even when semiconductor wafers are processed by the same processing machine, the quality of each of the wafers may differ to such an extent that badly affects a non-defective rate. Accordingly, for the purpose of improving the quality, it is necessary to accumulate such data that show a correlation between quality and working conditions on the wafer basis.

Conventionally, semiconductor wafers are manufactured on a lot basis (a group of about 20-300 wafers having same characteristics required), and quality information including operation results are managed usually in the form of a daily report in which the quality information is listed by an operator on a lot basis.

However, this method has a problem that important wafer-based quality information such as, from which position of a material ingot, a wafer was cut out, by which thermal treatment machine, the wafer was processed, at which position of a bath of a cleaning equipment, the wafer was cleaned, etc. cannot be managed, thus resulting in lack of the necessary information for quality improvement. Further, since the management of the quality information is manually carried out in this method, this results in reduction of the reliability of the information and in the increased number of necessary management steps.

Furthermore, since the management is carried out on a lot basis, in the case where the next step is such a batch processing step as a cleaning or chemical treatment step, the processing cannot proceed to the next step until one-lot processing is finished, which results in the fact that a wait time is increased and thus a processing time includes a useless waste time, which impedes, in particular, cost reduction in a recent tendency of small number/multiple sorts of items production.

In general, for the purpose of managing objects to be processed on an individual basis, there is employed such a method that a bar code or marker is applied to each of the objects and object management is effected on the basis of the bar code or mark as an identification symbol. When the objects are semiconductor wafers, however, such application of the identification mark to the wafer in the above method is not preferable from the viewpoint of quality.

For example, such bar code becomes one of serious pollution sources at the time of cleaning the wafers. Further, when laser marking is carried out, the mark must be made fairly deep, which might involve fluctuations in the wafer characteristics caused by a high level of laser energy. In addition, pollution substances tend to accumulated in the marks, which might lead to undesirable influences on other wafers. And some products must be subjected to such a step that the marking is never allowed.

In this way, the conventional method has a problem that wafer-basis quality information cannot be managed easily and sufficiently.

DISCLOSURE OF THE INVENTION

In view of such circumstances, the present invention has been made to provide an apparatus and method for manufacturing semiconductor wafers which, with respect to each of the wafers to be processed, can identify, at any stage of processing steps, to what numbered wafer the cut-out wafer corresponds in a material ingot, and under what conditions the wafer was so far subjected to treatments.

That is, an object of the present invention is to provide an apparatus and method for manufacturing semiconductor wafers, which can manage easily and sufficiently quality information of any sorts of wafers on an individual basis.

In accordance with an aspect of the present invention, there is provided a method for manufacturing semiconductor wafers, in which an identification number is set for each of the semiconductor wafers, the identification numbers are stored in a storage medium as identifier information, a processing path as new identifier information indicative of how the wafer was transferred and how the wafer was processed in each of wafer manufacturing steps is traced on each wafer basis in association with the identifier information in a previous step and the new identifier information are additionally stored in the storage medium as wafer information, and management is carried out over history of each wafer throughout the entire wafer manufacturing steps on the basis of the stored wafer information.

In accordance with another aspect of the present invention, there is provided an apparatus for manufacturing semiconductor wafers which comprises identification number applying means for setting an identification number for each of the semiconductor wafers and for storing the identification numbers in a storage medium as identifier information, wafer information storing means for tracing as new identifier information a processing path indicative of how the wafer was transferred and how the wafer was processed in each of wafer manufacturing steps on each wafer basis in association with the identifier information in a previous step and for additionally storing the new identifier information as wafer information in the storage medium, and wafer history management means for performing management over history of each wafer throughout the entire wafer manufacturing steps on the basis of the stored wafer information.

In the invention, for example, an identification number is applied to each of wafers cut out from a material ingot in their cut-out order, the processing path indicative of how each wafer was transferred in each of the manufacturing steps is traced and then stored as the wafer information.

It is desirable that the processing path be expressed in terms of a number of a manufacturing machine and wafer positional coordinates in a jig.

Further, as the storage medium, a computer and a computer network are utilized.

In accordance with the present invention, since wafer identification can be realized on each wafer basis, wafer quality management can be reliably realized on each wafer basis with a less number of steps.

Further, since the need for management based on each lot can be eliminated and management based on each wafer can be realized, even when the next step corresponds to such a batch processing step as a cleaning step or a chemically processing step, the wafer can be shifted to the next step on each processing-batch basis, a processing waste time can be reduced, and the invention can be effectively applied to small number/multiple sorts of items production.

Also since the wafer identification can be carried out while eliminating the need for applying to the wafer such external identifier information as a marker by means of printing or laser, the deterioration of the wafer quality caused by such marking can be avoided.

When processing result data are accumulated on each wafer basis, wafer defect factors can be closely found, which leads to an increased wafer non-defective rate.

In addition, since such a wafer physical characteristic as an electric resistance can be presented on each wafer basis, even when it is desired to build a device in the wafer, close adjustment can be achieved and thus this leads to an improved non-defective rate of the device itself.

BRIEF DESCRIPTION OF THE DRAWINGS

FIG. 4 shows identification data for use in the embodiment of the present invention;

FIG. 8 shows identification data for use in the embodiment of the present invention;

BEST MODE FOR CARRYING OUT THE INVENTION

An embodiment of the present invention will be detailed with reference to the accompanying drawings.

Figure 1:
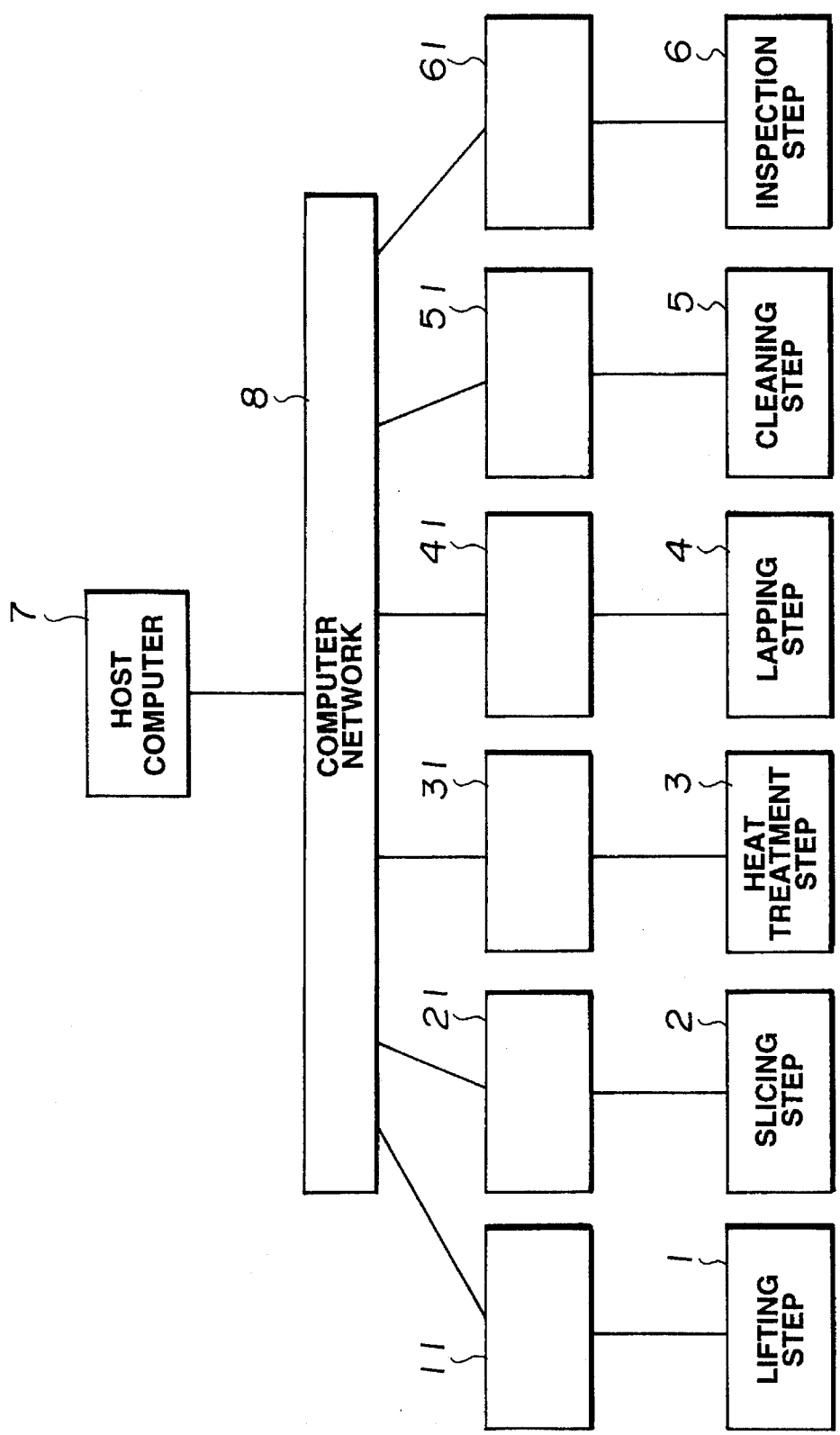
FIG. 1 schematically shows a management system in accordance with an embodiment of the present invention.

Referring to FIG. 1, there is shown a schematic arrangement showing steps of a silicon wafer manufacturing method in accordance with an embodiment of the present invention.

The silicon-wafer manufacturing method includes a lifting step 1 for forming a material ingot with use of a Czochralski (CZ) method of growing a cylindrical crystal from a material (silicon) melt within a crucible, a slicing step 2 for cutting the material ingot into wafers, a heat treatment step 3 for removing crystal defects or the like, a lapping step 4 for polishing surfaces of the wafers into accurate mirror surfaces, a cleaning step 5 for cleaning the mirror-polished wafers to remove from the wafers such deposits adhered on the surfaces of the wafers as dust and chemicals, and an inspection step 6 for inspecting the conditions of these processing steps to check non-defective and defective wafers or to perform feed-back of quality information. These steps 1 to 6 are connected with a computers 11 for management of the lifting step, a computer 21 for management of the slicing step, a computer 31 for management of the heat treatment step, a computer 41 for management of mirror-polishing step, and a computer 61 for management of the inspection step respectively to manage the transportation path and quality information of each wafer with respect to each of the steps and to inform the other steps of the management result. The computers for management of the respective steps are also connected to a host computer 7 through a computer network 8 known as LAN, at which a correspondence between the quality information reported on the wafer basis and associated wafers is made and a put into a database.

Figure 2:
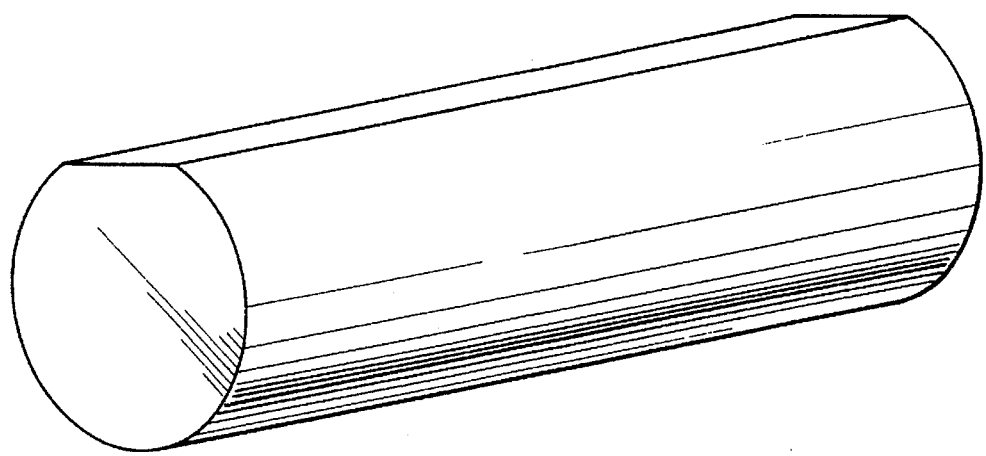
FIG. 2 shows a single crystalline silicon for use in the present invention.
Figure 3:
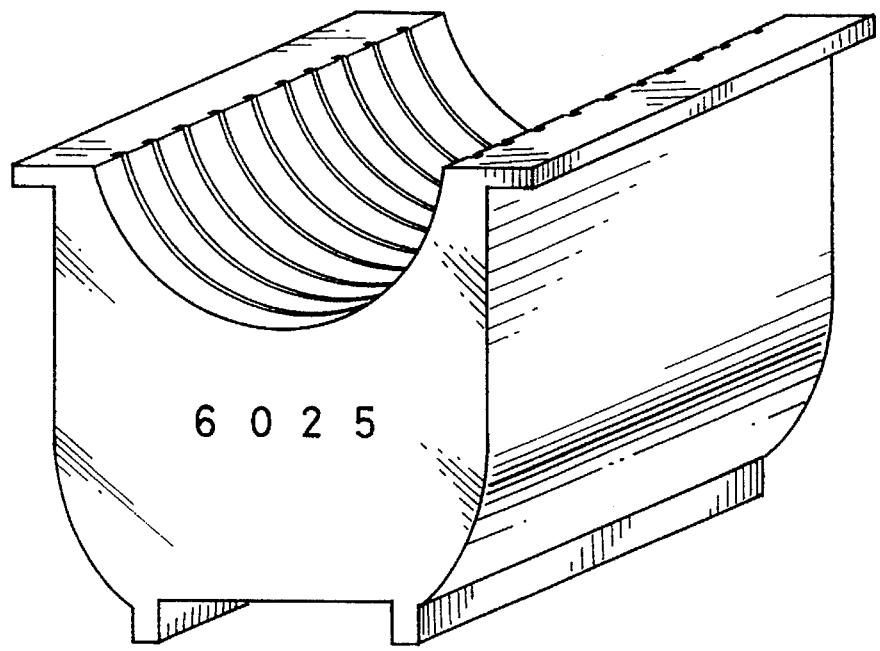
FIG. 3 shows a transporter for use in the embodiment of the present invention.

More in detail, first of all, when such a silicon ingot as shown in FIG. 2 is formed in the lifting step, the ingot is cut into wafers in the slicing step 2, at which time numbers are sequentially set at the wafers in the cut-out sequence. The cut-out wafers are individually separately housed in such a transport jig (carrier) as shown in FIG. 3. In this case, the numbers of grooves of the transport jig, the numbers of the housed wafers, and the number of the jig are recorded in a relationship mutually related to one another, and the recorded information is informed to the other steps through the computer network 8. As a result, as shown by exemplary identification data in FIG. 4, identification between the wafers can be expressed in terms of the positions of the grooves. In the case where the wafers are automatically housed into the associated grooves of the transport jig, correlation between the grooves and wafers is automatically made. In the case where the wafers are manually housed into the grooves of the transport jig, the wafer identification can be realized by reading it by means of bar code reader or an image recognizer.

The wafers cut in the slicing step 2 in this manner are housed in the transport jig and again housed in a heat treatment jig. In this case, if the wafers after subjected to the heat treatment step are again housed into the transport jig from the heat treatment jig with the initial housing positions of the wafers kept, then the wafers remain in an identifiable state.

Figure 5:
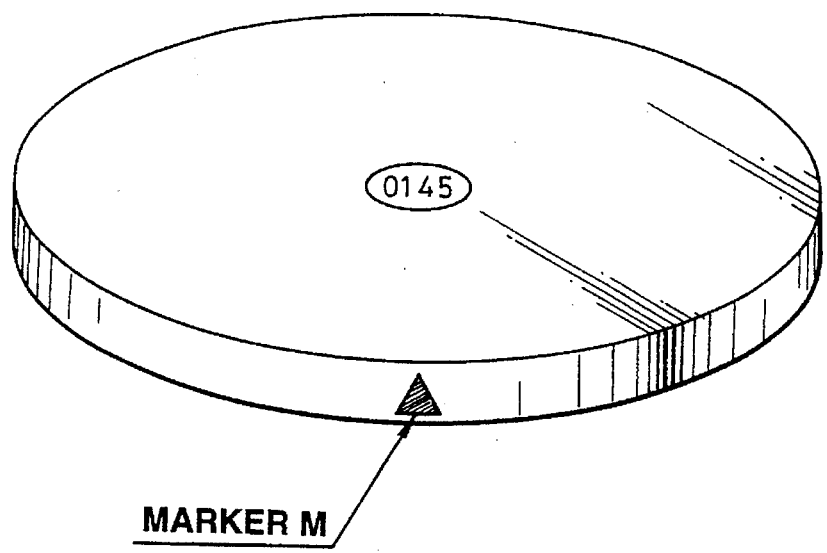
FIG. 5 shows a circular plate for use in the embodiment of the present invention.

In the lapping step, further, the wafers fed from the heat treatment step and being housed in the transport jig are one by one bonded on wafer-lapping jigs. In this step, e.g., about 4–10 wafers are separately bonded on such a circular plate having a marker M as shown in FIG. 5. About 4 of such plates having wafers bonded thereon are rotated together to cause the wafers to be slid at their one side surfaces with respect to an abrasive cloth, while an abrasive agent is applied to the wafers to polish the wafers. Accordingly, when the wafers are bonded on the circular plate sequentially from the position of the marker M, the wafers can be easily identified even after the rotation of the plate.

Figure 6:
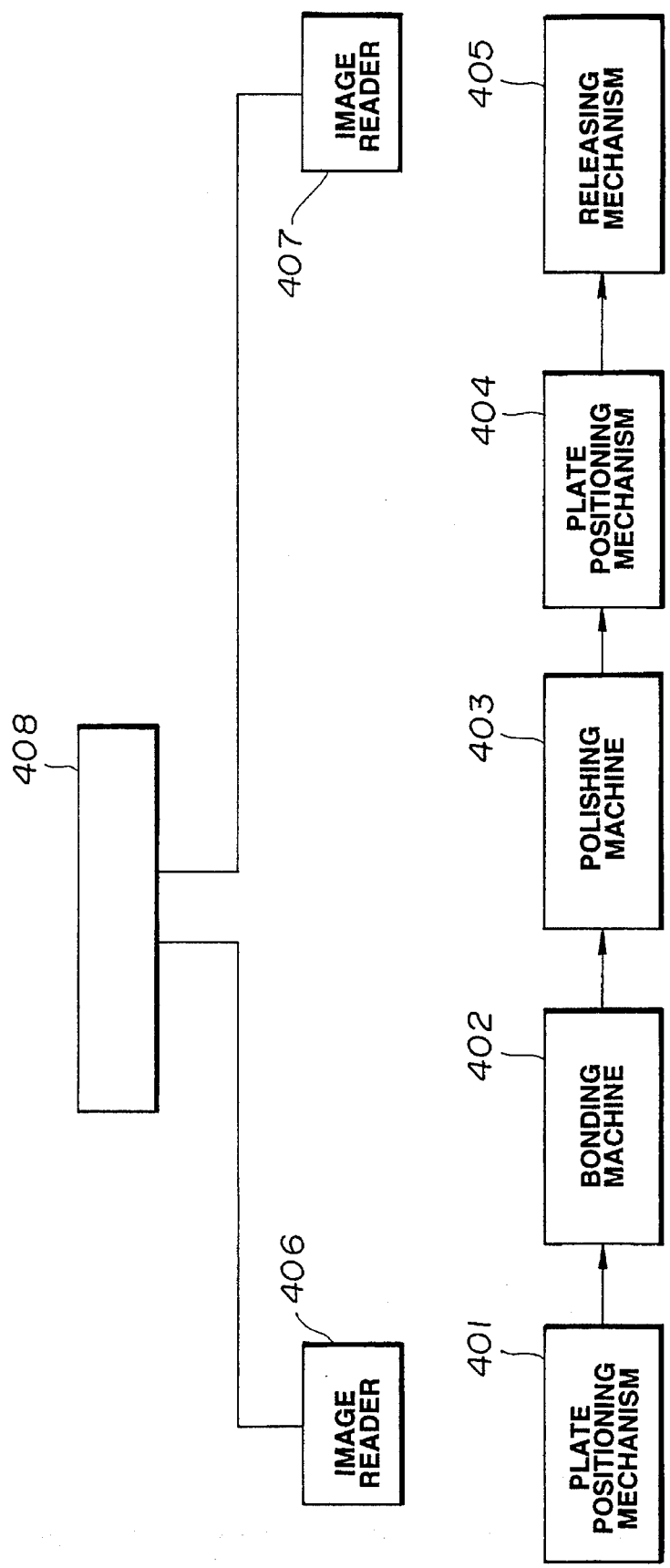
FIG. 6 is a block diagram of a lapping machine for use in the embodiment of the present invention.

The above processing operations will be explained in the following. As shown in FIG. 6, the position of the marker M is detected by a plate positioning mechanism 401 and then modified so that the marker M is initially located at the wafer bonded position.

Figure 7:
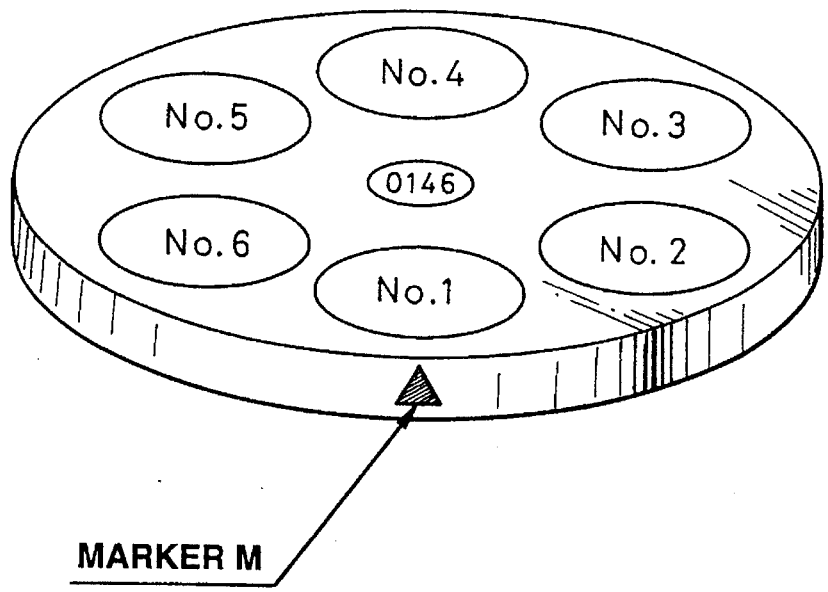
FIG. 7 shows an example of how wafers are mounted on the circular plate used in the embodiment of the present invention.

Under such a condition that the position of the plate is rotatably modified so that the first-wafer bonding position comes at a bonding machine 402 side, the wafers are sequentially bonded with use of the bonding machine 402. In this case, as shown in FIG. 7, identification numbers are set for the wafers sequentially in the plate rotational direction in relation as their wafer numbers. And the number of the plate is read out with use of a bar code reader or an image recognizer to make correspondence between the wafer numbers and plate number. Next, a polishing machine is used to rotate a plurality (4 in the illustrated example) of plates having wafers bonded thereon together for their polishing. When the polishing is completed, a plate positioning mechanism 404 is used to detect the position of the marker M and to change its rotary position relative to the reference position of the marker M in such a manner that the firstly bonded wafer comes at the first release position. After the position of the plate is modified so that the firstly bonded wafer comes at a release mechanism 405, the release mechanism 405 is operated to sequentially release the wafers in their bonded order. And the released wafers are made associated with the number of the transport jig, the associated groove positions and the wafer numbers. Even in the releasing step, a bar code reader or image reader 407 is used to read out the plate number and make correspondence between the plate number and wafer numbers. In this way, after the plate is positioned, wafers are sequentially released one after another in the bonded order, and then housed into the transport jig. Even at the time of housing the wafers, the released wafers are sequentially housed one after another as associated with the number of the transport jig, groove positions and wafer numbers.

In this way, the identification numbers of the wafers are correctly held.

Shown in FIG. 8 is an example of data showing relationships between the wafer numbers, plates and transport jigs. Under such a condition that the computer 41 for management of the lapping step made correspondence between the quality information and wafer numbers in this way, the correspondence information is transmitted to the computer 7.

Figure 9:
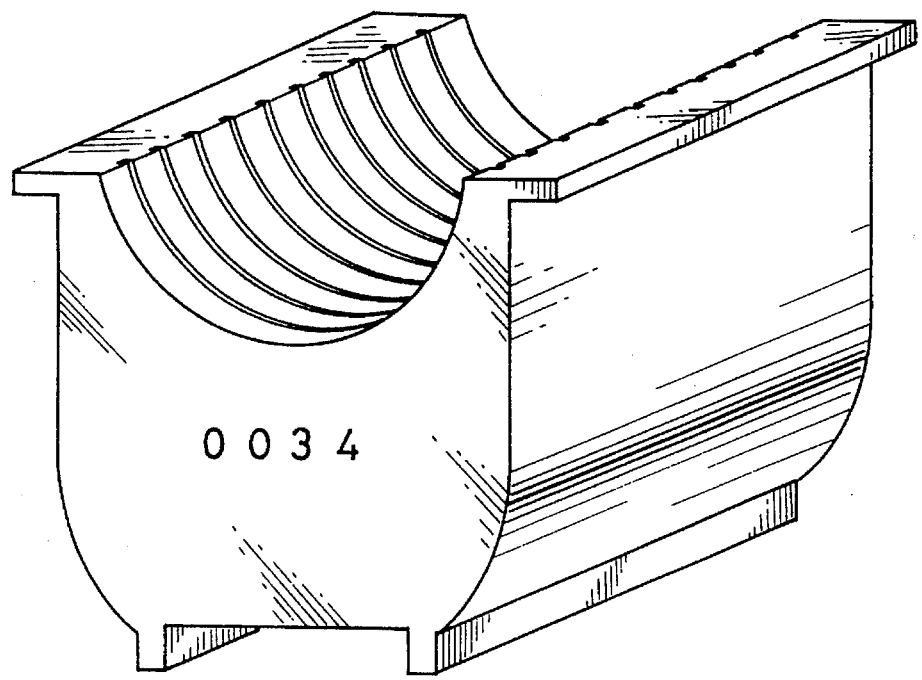
FIG. 9 shows a cleaning machine for use in the embodiment of the present invention.

In the cleaning step, the wafers are moved from the transport jig to a cleaning jig and from the cleaning jig to the transport jig. FIG. 9 shows a cleaning jig. In the case where a cleaning jig having a groove structure similar to the transport jig is employed as shown in FIG. 9, if correspondence between the jig number and groove numbers are kept at the time of moving the wafers from the transport jig to the cleaning jig and vice versa, the history of wafer movement can be managed. Accordingly, even in this step, the wafer identification number can be maintained in the form of transport jig position.

Figure 10:
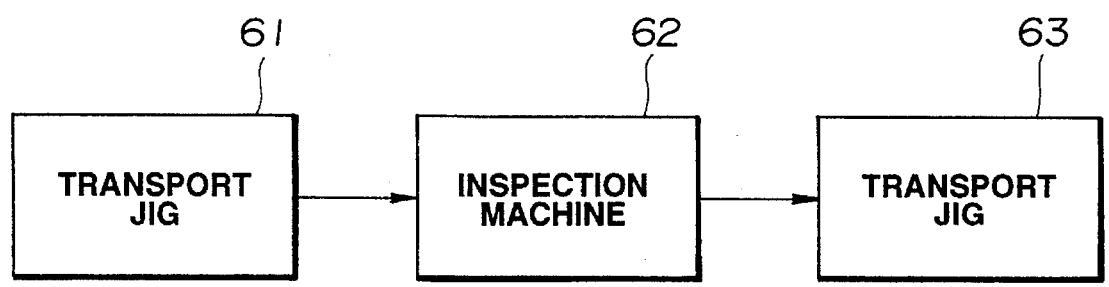
FIG. 10 shows an inspection system for use in the embodiment of the present invention.

Further, in the inspection step, transfer from one transport jig to another transport jig is carried out as shown in FIG. 10. Even in this case, when management is carried out with the correspondence between the jig numbers and groove numbers kept, the wafer identification number can be maintained. Reading of the jig number may be carried out by an image reader. Further, a bar code may be used for indication of the jig number.

When the each-wafer-basis quality information managed in this way are collectively managed under control of the host computer through such a computer network as shown in FIG. 1, the maintenance and effective re-use of the information can be highly effectively realized.

Since the management is carried out not on each lot basis but on each wafer basis, such a defect that is caused by a difference in processing condition between the end and central parts of a jig e.g., in the heat treatment step can be easily found, whereby accurate correction can be facilitated and thus close management can be realized.

Although the present invention aims principally at the wafer quality management, the invention may be utilized even in physical distribution and cost control on each wafer basis.

Further, since history information is obtained at the end of each of the steps and detection of a defect enables re-setting or re-adjustment of conditions in the previous steps for its correction, modification of the conditions can be attained at an earlier stage and thus frequent occurrence of defects can be prevented.

Furthermore, since the need for control based on each lot is eliminated, even when the next step corresponds to such a batch processing step as a cleaning step or a chemical processing step, wafers can be transferred to the next step on each carrier basis, whereby a processing waste time can be reduced and thus the invention can be effectively employed in small number/multiple sorts of items production.

The present invention is not limited to such a specific embodiment for performing management over all the steps as the foregoing embodiment, but management may be carried out only over part of the processing steps.

INDUSTRIAL APPLICABILITY

As has been explained in the foregoing, in accordance with the present invention, the wafers cut out in the slicing step can be identified in each of the steps up to the last-stage one on each wafer basis, operating conditions in each step can be accumulated in relation to each wafer, wafer management can be realized in an accurate manner without deteriorating the wafer quality.

We claim:

1. An apparatus for manufacturing a plurality of semiconductor wafers, comprising:

identification number applying means for setting an identification number for each of the plurality of semiconductor wafers, said identification number corresponding to a location in a material ingot that a semiconductor wafer was cut from, and for storing the identification numbers in a storage medium as identifier information;

wafer information storing means for tracing as new identifier information a processing path indicative of how the wafer was transferred and how the wafer was processed in each of manufacturing steps on each wafer basis in association with the identifier information in a previous step and for additionally storing the new identifier information as wafer information in the storage medium; and wafer history management means for performing management over history of each wafer from a lifting step for forming the material ingot throughout entire wafer manufacturing steps on the basis of the stored wafer information.

2. An apparatus for manufacturing semiconductor wafers as set forth in claim 1, characterized in that the new identifier information is expressed in terms of wafer positional coordinates in a jig for accommodation of the wafer in each step.

3. A method for manufacturing semiconductor wafers, comprising:

a step of setting an identification number for each of the semiconductor wafers, said identification number corresponding to a location in a material ingot that a semiconductor wafer was cut from, and of storing the identification numbers in a storage medium as identifier information; and a wafer information additional storing step of tracing as new identifier information a processing path indicative of how the wafer was transferred and how the wafer was processed in each of manufacturing steps on each wafer basis in association with the identifier information in a previous step and of additionally storing the new identifier information as wafer information in the storage medium, characterized in that management is carried out over history of each wafer from a lifting step for forming the material ingot throughout entire wafer manufacturing steps on the basis of the stored wafer information.

4. A method for manufacturing semiconductor wafers as set forth in claim 3, characterized in that the new identifier information is expressed in terms of wafer positional coordinates in a jig for accommodation of the wafer in each step.

* * * * *